United States Patent
Wong et al.

(10) Patent No.: US 6,866,182 B2
(45) Date of Patent: Mar. 15, 2005

(54) APPARATUS AND METHOD TO PREVENT OXIDATION OF ELECTRONIC DEVICES

(75) Inventors: Yam Mo Wong, Singapore (SG); Ka Shing Kenny Kwan, Singapore (SG); Rong Duan, Singapore (SG); Zhao Ya Rui, Singapore (SG)

(73) Assignee: ASM Technology Singapore PTE Ltd. (SG)

( * ) Notice: Subject to any disclaimer, the term of this patent is extended or adjusted under 35 U.S.C. 154(b) by 247 days.

(21) Appl. No.: 10/267,143

(22) Filed: Oct. 8, 2002

(65) Prior Publication Data

US 2004/0065720 A1 Apr. 8, 2004

(51) Int. Cl.[7] ............................. B23K 31/02; B23K 1/06
(52) U.S. Cl. ..................... 228/219; 228/4.5; 228/180.5; 228/42
(58) Field of Search .................. 228/219, 220, 228/180.5, 4.5, 42

(56) References Cited

U.S. PATENT DOCUMENTS

| | | | | |
|---|---|---|---|---|
| 4,998,002 A | * | 3/1991 | Okikawa et al. | 219/56.22 |
| 5,232,144 A | * | 8/1993 | Carney et al. | 228/6.2 |
| 5,364,007 A | * | 11/1994 | Jacobs et al. | 228/42 |
| 5,569,075 A | * | 10/1996 | Leturmy | 454/66 |
| 5,981,897 A | * | 11/1999 | Offer et al. | 219/75 |
| 6,412,681 B2 | * | 7/2002 | Mukuno et al. | 228/46 |

FOREIGN PATENT DOCUMENTS

JP        63055949 A  *  3/1988

* cited by examiner

Primary Examiner—Kiley S. Stoner
Assistant Examiner—Kevin McHenry
(74) Attorney, Agent, or Firm—Ostrolenk, Faber, Gerb & Soffen, LLP

(57) ABSTRACT

The invention provides an apparatus and a method for preventing oxidation of an electronic device, such as a semiconductor leadframe, when it is heated. The apparatus comprises an area in which said device is to be heated and inlet means adapted to supply a relatively inert gas to the said area. In particular, the apparatus includes a porous distribution element through which the inert gas is passed from the inlet means to said area, whereby to protect the electronic device in the area from oxidation.

11 Claims, 3 Drawing Sheets

APPARATUS AND METHOD TO PREVENT OXIDATION OF ELECTRONIC DEVICES

FIELD OF THE INVENTION

The invention relates to an apparatus and method to minimize oxidation of electronic devices made from certain reactive metals, such as leadframes, during semiconductor package assembly processes. The invention is particularly applicable to ultrasonic wire bonding of copper alloy leadframes, although it is capable of wider application.

BACKGROUND AND PRIOR ART

Semiconductor leadframes serve as a substrate for the manufacture of certain semiconductor packages. Conventionally, leadframes are made from iron alloys. However, with an increasing demand for higher performance miniaturized packages, more reactive metals, in particular copper alloy leadframes are finding increasing applications in semiconductor packages. These leadframes are found to be more attractive than iron alloy leadframes due to factors such as better heat dissipation, ease of processing and cost. On the other hand, the disadvantage of copper alloy is that it is prone to oxidation (ie. it reacts with oxygen to produce copper oxide) when exposed to oxygen in the air at high temperatures. Such oxidation results in oxygen forming weak bonds with the atoms at the leadframe surface, and a layer of brittle and/or poorly adhering oxides. Thus, oxidation introduces reliability problems for microelectronic packages.

The problem of oxidation is particularly acute during wire-bonding in a typical semiconductor packaging process, wherein conductive bonding wires are bonded to contact surfaces on a semiconductor die and a leadframe to establish electrical connections therebetween. This bonding is commonly done by using an ultrasonic transducer to generate mechanical vibration energy with an external pressure force to bind the wire to the die and leadframe surfaces. However, heat generated during the process may oxidize the surface of the leadframe, leading to non-stick or unreliability of the bond. Oxidation during the wire-bonding process should thus be arrested or reduced.

A typical wire bonder uses a window clamp, which is usually rectangular in design, to clamp a leadframe securely to a top plate. An industry practice for protecting leadframes from oxidation is to introduce large amounts of a relatively inert gas, usually nitrogen gas, to the leadframe. Various apparatus have been used to do this. In a typical apparatus, an area of the leadframe is covered by the body of the clamp and is thus relatively well-protected from oxidation, leaving an opening inside the body of the window clamp as a bonding area. The bonding area is exposed to the atmosphere, and is most vulnerable to oxidation.

One method of introducing nitrogen gas is to locate one or more nozzles next to the bonding area to blow nitrogen gas into the bonding area. (FIG. 1) The nitrogen in the environment around the bonding area would tend to inhibit oxidation reaction of the leadframe at the high bonding temperatures. However, the use of nozzles creates a negative pressure around the region of the nozzle opening, sucking air towards the nozzle opening. After several minutes, the effectiveness of the nozzle will be diminished due to the oxygen drawn in from the atmosphere mixing with the nitrogen gas discharge.

Another method of introducing nitrogen gas is to have one or more gas blower outlets in a top plate on which the leadframe rests for the gas to be discharged into the bonding area. (FIG. 2) This method has a disadvantage in that it is difficult for a manufacturer to manufacture a top plate with many small holes as outlets for the nitrogen gas, bearing in mind that the surface of the top plate has to be substantially even to allow wire-bonding to be effectively performed on it.

This design also has the problem of negative pressure being created around the outlets of the top plate. After a while, the negative pressure causes oxygen in the air to be drawn to the openings and mixed with nitrogen gas, reducing its effectiveness. Furthermore, it should be appreciated that such a method only works where the surface of the leadframe itself has through-holes to allow gas to enter the bonding area inside the wire clamp. If there are no such through-holes, the method is not effective.

A third method is to use a movable cover together with the first method and/or the second method (FIG. 3), its purpose being to prevent as far as possible nitrogen gas from escaping from the bonding area. The movable cover has a through-hole to allow a capillary of a bonding member to extend into the bonding area. However, the addition of an additional part to the wire bonder (specifically, the bond head of the wire bonder) affects the bonding performance of the machine. The cover will also block an operator's view of the leadframe as it is being bonded, and makes the bond area inaccessible when, for example, a bond wire breaks. The cover size is also too large when there is a large bond area. Moreover, there is a risk of the wire clamp hitting the moving cover when the wire clamp is moved up to release a leadframe.

SUMMARY OF THE INVENTION

Bearing in mind the aforesaid problems with conventional methods of introducing nitrogen gas to prevent oxidation of leadframes during wire bonding operations, it is an object of the present invention to seek to provide an improved apparatus and method to introduce a relatively inert gas to the bonding area to prevent oxidation of leadframes.

According to a first aspect of the invention there is provided an apparatus for preventing oxidation of an electronic device when it is heated, comprising:

(i) an area in which said device is to be heated;

(ii) inlet means adapted to supply a relatively inert gas to the said area; and (iii) a porous distribution element through which the inert gas is passed from the inlet means to said area, whereby to protect the electronic device in the area from oxidation.

According to a second aspect of the invention there is provided a method to prevent oxidation of an electronic device when it is heated, comprising introducing a relatively inert gas through an inlet means to the electronic device to protect it from oxidation, wherein said gas is passed through a porous distribution element prior to introduction to the electronic device.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT

Figure 1:
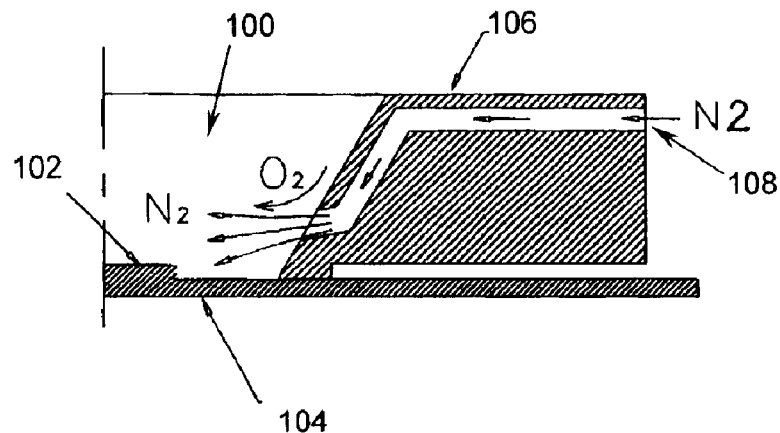
FIG. 1 is a cross-sectional view of nitrogen gas being introduced to a bonding area of a leadframe through a nozzle in a window clamp according to a first example of the prior art.

Referring to the drawings, in which like parts are referred to by like numerals, FIG. 1 is a cross-sectional view of a relatively inert gas, in this case nitrogen gas ($N_2$), being introduced to a bonding area 100 of a leadframe 104 through a nozzle 108 in a window clamp 106 according to a first example of the prior art. A die 102 attached to the leadframe 104 is located substantially centrally in an opening of the window clamp 106 to allow wire bonding to take place to connect electrical contacts on the die 102 and the leadframe 104.

As the wire bonding process is being performed, nitrogen gas is pumped through the nozzle 108 into the bonding area 100, to fill the environment in the bonding area with nitrogen gas, thereby protecting the leadframe from oxidation during wire bonding. However, due to a nozzle effect, low pressure will be created around the opening of the nozzle 108 such that oxygen ($O_2$) from the atmosphere is drawn in and mixed with the nitrogen. As a result, the effectiveness of pumping nitrogen gas into the bonding area to prevent oxidation is reduced.

Figure 2:
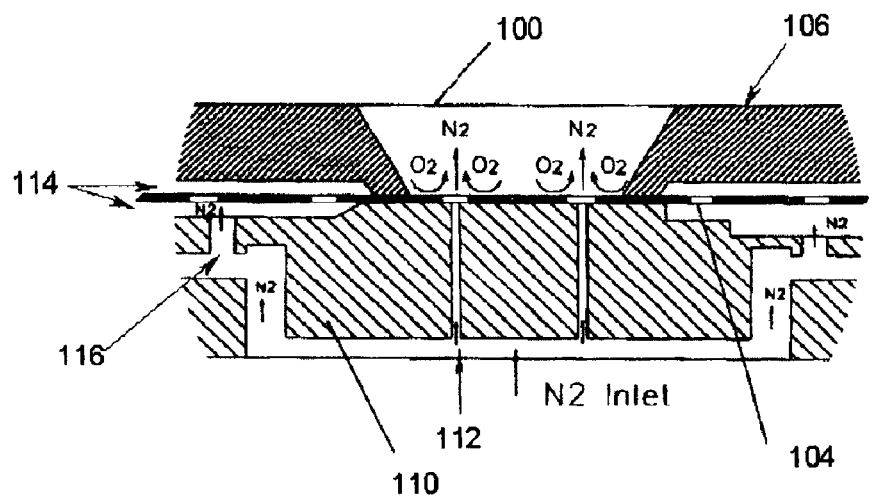
FIG. 2 is a cross-sectional view of nitrogen gas being introduced to the bonding area through gas outlets in a top plate carrying a leadframe according to a second example of the prior art.

FIG. 2 is a cross-sectional view of nitrogen gas being introduced to the bonding area 100 through gas outlets 112 in a top plate 110 carrying a leadframe 104 according to a second example of the prior art. In this design, nitrogen gas is introduced from below the leadframe 104, so this design is applicable generally only if there are openings on the leadframe 104 to allow nitrogen gas to pass through it and into the bonding area 100.

Besides blowing nitrogen gas into the bonding area 100, nitrogen gas may also be blown through secondary outlets 116 to portions 114 of the leadframe 104 between the window clamp 106 and top plate 110 outside the bonding area 100, although these portions 114 are not critical because they are less exposed to the atmosphere. Thus, other means may be used to separately introduce nitrogen gas to these portions 114.

Nevertheless, the nozzle effect will also occur in this design so that oxygen is drawn to the outlets and into the bonding area 100, thereby reducing the effectiveness of the apparatus.

Figure 3:
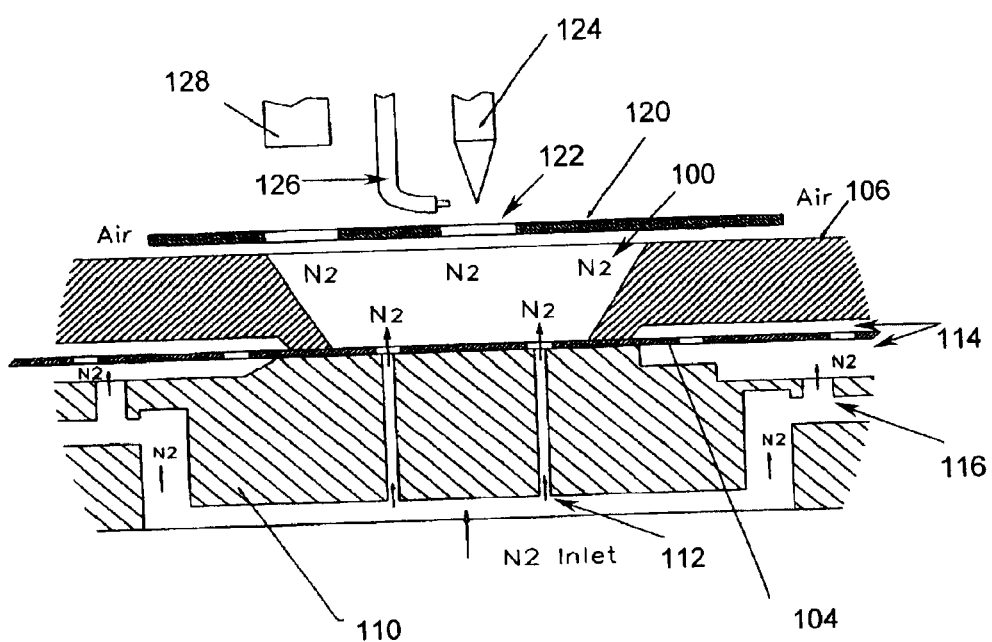
FIG. 3 is a cross-sectional view of a moving cover positioned over a window clamp to keep nitrogen gas inside the bonding area from escaping according to a third example of the prior art.

FIG. 3 is a cross-sectional view of a movable cover 120 positioned over a window clamp 106 to keep nitrogen gas inside the bonding area 100 from escaping according to a third example of the prior art. The movable cover 120 has a through-hole 122 to allow a capillary 124 carrying bonding wire to pass through the movable cover 120. A flame-off device 126 generates an electrical spark to form a ball bond when performing the wire bonding operation. The movable cover 120 is mounted on a bond-head of a wire bonder so as to move together with the bond head. An optical device 128 is used for Pattern Recognition (PR). Nitrogen gas may be introduced to the bonding area 100 through nozzle inlets 112 leading to outlets in a top plate 110 as well as secondary gas inlets 116.

Figure 4:
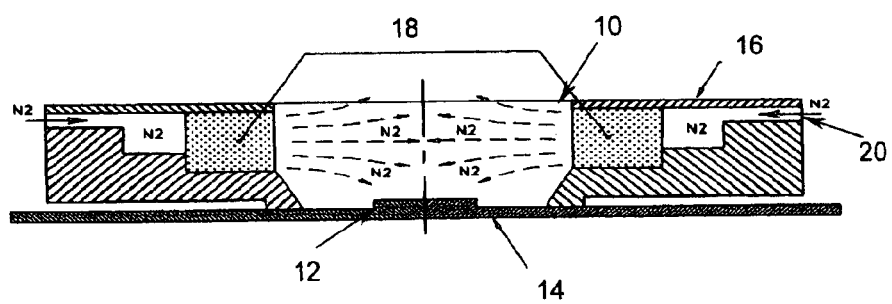
FIG. 4 is a cross-sectional view of a layer of porous material located on a window clamp to introduce nitrogen gas into a bonding area according to a first embodiment of the invention.

FIG. 4 is a cross-sectional view of apparatus embodying the invention, which comprises a porous distribution element in the form of a layer of porous material 18 carried by as by being coupled to holding means for an electronic device, which may be a copper alloy leadframe 14. The holding means may be in the embodiment in the form of a window clamp 16. Relatively inert gas such as nitrogen is introduced into a bonding area 10 of the leadframe 14 after passing through the layer of porous material 18. A die 12 attached to the leadframe 14 is exposed substantially centrally in an opening within the window clamp 16. Nitrogen gas is pumped into the window clamp 16 through inlet means in the form of a channel 20, but the window clamp 16 is modified so that the porous material 18 is coupled to the window clamp 16 between the channel 20 and the bonding area 10, so that the gas is passed through the porous material 18 before being introduced into the bonding area 10.

The advantage of using porous material 18 intermediate the channel 20 and the bonding area 10 is that the nitrogen gas is now more evenly distributed over a larger area than hitherto when it is introduced into the bonding area 10. It has been found that this effectively reduces negative pressure around the region where the nitrogen gas is introduced, as there is no nozzle which creates such negative pressure. In turn, the effectiveness of the nitrogen gas to prevent oxidation of the leadframe during wire bonding is significantly increased since the problem of oxygen gas being mixed with the nitrogen gas is obviated.

A suitable porous material is porous metal made from highly compressed metal powder, such as stainless steel powder. An example is porous metal media manufactured by Mott Corporation.

Figure 5:
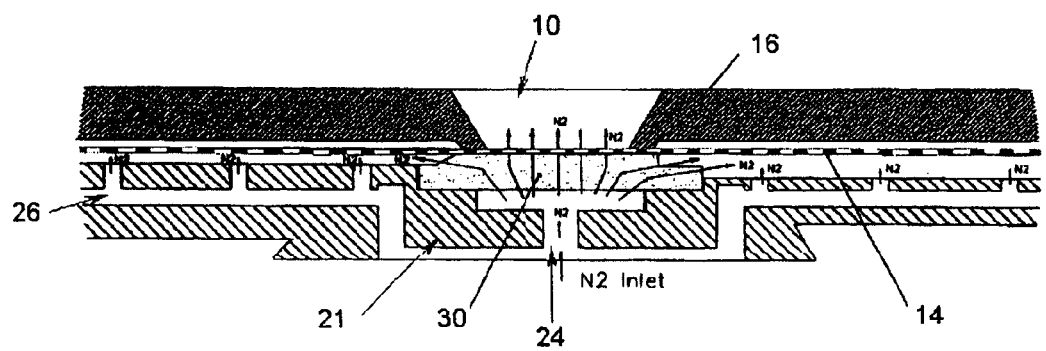
FIG. 5 is a cross-sectional view of a layer of porous material located on a top plate to introduce nitrogen gas into a bonding area according to a second embodiment of the invention.

FIG. 5 is a cross-sectional view of a second embodiment of the invention, comprising a distribution element of porous material 30 supported by as by being coupled to a surface of a top plate 21 on which the leadframe 14 is placed, to introduce nitrogen gas into a bonding area 10. The leadframe 14 is clamped by a window clamp 16 onto the top plate 21. Nitrogen gas is blown into the bonding area 10 via a gas inlet 24 made in the top plate 21. The top plate 21 is modified such that the layer of porous material 30 in the form of a layer thereof is coupled to the end of the gas inlet 24 at the surface of the top plate 21 adjacent to the bonding area 10.

As in the previous embodiment, the porous material 30 distributes the nitrogen gas more evenly and over a larger area to reduce the negative pressure which might affect the effectiveness of the apparatus. Additionally, the porous material may be designed such that the nitrogen gas is also distributed to the portion of the leadframe 14 located between the window clamp 16 and the top plate 21. This is to further protect portions of the leadframe 14 away from the bonding area from oxidation. Furthermore, more nitrogen gas may be introduced to the said portion via secondary gas inlets 26 in the top plate.

It will be appreciated that the embodiment described in FIG. 5 is suitable for leadframes 14 that have openings to allow nitrogen gas introduced from below to enter into the bonding area 10, but may not be suitable if there are no such openings to allow nitrogen gas to be so transmitted.

It will also be appreciated that either one of the respective embodiments in FIGS. 4 and 5 may be used, depending on the application and type of leadframe. Further, the two embodiments may be used together, such that nitrogen gas is introduced both via the holding means or the window clamp 16 as well as the surface of the top plate 21 simultaneously to increase the concentration of nitrogen in the bonding area. Thus, apparatus embodying the invention provides nitrogen gas more effectively without creating negative pressure in the bonding area 10 and prevents oxidation for a longer time as compared to the prior art.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for preventing oxidation of an electronic device when it is heated on a surface, comprising:
   (i) an area in which the electronic device is to be heated;
   (ii) an inlet adapted to supply a relatively inert gas to the area;
   (iii) a porous distribution element through which the inert gas is passed from the inlet to the area to protect the electronic device in the area from oxidation; and
   (iv) a holding arrangement operative to clamp the electronic device to the surface, the porous distribution element being contained within the holding arrangement.

2. An apparatus according to claim 1, wherein the inlet includes an inlet channel adjacent to the area, the inlet channel having an end, and the distribution element comprises a first layer of porous material at the end of the inlet channel.

3. An apparatus according to claim 2, further comprising a second layer of porous material on at least a portion of the surface on which the electronic device is placed.

4. An apparatus according to claim 1, wherein the porous material comprises a compressed metal powder.

5. An apparatus according to claim 4, wherein the metal powder is a stainless steel powder.

6. An apparatus according to claim 1, wherein the area is dimensioned to receive a wire bonding machine for performing a wire bonding operation on the electronic device.

7. An apparatus according to claim 6, wherein the inlet gas is nitrogen.

8. An apparatus according to claim 1, wherein the electronic device is a copper alloy leadframe, and the area is dimensioned to receive the copper alloy leadframe.

9. A method to prevent oxidation of an electronic device when it is heated, the method comprising:
   clamping the electronic device to a surface using a holding arrangement including a porous distribution element; and
   introducing a relatively inert gas through an inlet and to the electronic device to protect the electronic device from oxidation by passing the inert gas through the porous distribution element prior to introduction to the electronic device.

10. A method according to claim 9, wherein the distribution element comprises a first layer of porous material and wherein the inlet comprises a channel having an end, the distribution element being positioned at the end of the channel where the relatively inert gas exits the channel.

11. A method according to claim 10, wherein at least a portion of the surface on which the electronic device is placed is provided with a second layer of porous material.

* * * * *

UNITED STATES PATENT AND TRADEMARK OFFICE
CERTIFICATE OF CORRECTION

PATENT NO. : 6,866,182 B2
DATED : March 15, 2005
INVENTOR(S) : Wong et al.

It is certified that error appears in the above-identified patent and that said Letters Patent is hereby corrected as shown below:

Title page,
Item [73], Assignee, should read:
-- ASM Technology Singapore Pte Ltd --

Signed and Sealed this

Thirty-first Day of May, 2005

JON W. DUDAS
*Director of the United States Patent and Trademark Office*